United States Patent
Wheeler et al.

(10) Patent No.: US 6,855,480 B2
(45) Date of Patent: Feb. 15, 2005

(54) PHOTORESIST COMPOSITION

(75) Inventors: Stephen H. Wheeler, Newport Beach, CA (US); Randall W. Kautz, Irvine, CA (US); Robert K. Barr, Shrewsbury, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 193 days.

(21) Appl. No.: 10/118,225

(22) Filed: Apr. 6, 2002

(65) Prior Publication Data

US 2003/0059709 A1 Mar. 27, 2003

Related U.S. Application Data

(60) Provisional application No. 60/284,725, filed on Apr. 19, 2001, and provisional application No. 60/285,835, filed on Apr. 23, 2001.

(51) Int. Cl.$^7$ .................. G03C 1/73; G03F 7/028; G03F 7/032; G03F 7/20; G03F 7/30
(52) U.S. Cl. .................. 430/287.1; 430/288.1; 430/281.1; 430/285.1; 430/284.1; 430/325; 430/906; 430/905; 430/910; 430/907; 430/311; 430/319; 430/916; 430/270.1
(58) Field of Search .................. 430/281.1, 285.1, 430/287.1, 288.1, 284.1, 325, 906, 905, 910, 907, 311, 319, 916, 270.1

(56) References Cited

U.S. PATENT DOCUMENTS

| | | | |
|---|---|---|---|
| 3,953,309 A | 4/1976 | Gilano et al. | 428/458 |
| 4,003,877 A | 1/1977 | Lipson et al. | 430/308 |
| 4,610,951 A | 9/1986 | Lipson et al. | 430/313 |
| 4,710,446 A | * 12/1987 | Hoffmann et al. | 430/281.1 |
| 5,227,281 A | 7/1993 | Gaschler et al. | 430/325 |
| 5,789,372 A | 8/1998 | Fabry | 510/502 |
| 5,807,927 A | 9/1998 | Stockinger et al. | 525/58 |
| 5,932,020 A | 8/1999 | Murphy | 134/2 |
| 5,939,239 A | 8/1999 | Lundy et al. | 430/284.1 |
| 5,962,180 A | 10/1999 | Iwanaga et al. | 430/170 |
| 5,998,348 A | 12/1999 | Murphy | 510/243 |
| 6,017,872 A | 1/2000 | Pedersen et al. | 510/424 |
| 6,127,101 A | 10/2000 | Lassila et al. | 430/331 |

* cited by examiner

*Primary Examiner*—Cynthia H. Kelly
*Assistant Examiner*—Sin J. Lee
(74) *Attorney, Agent, or Firm*—John J. Piskorski

(57) ABSTRACT

Disclosed are photoimageable compositions having improved stripping properties as well as methods for manufacturing printed wiring boards using such photoimageable compositions.

18 Claims, No Drawings

PHOTORESIST COMPOSITION

This application claims the benefit of U.S. Provisional Application(s) No. 60/284,725 filed Apr. 10, 2001 and Ser. No. 60/285,835 filed Apr. 23, 2001.

BACKGROUND OF THE INVENTION

This invention relates generally to the field of photoresists. In particular, this invention relates to the field of photoresists having improved stripping properties, especially suitable for use in printed wiring board manufacture.

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or cross-link in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble.

In general, photoresist compositions include at least a resin binder component, a monomer and a photoactive agent. A wide variety of polymeric or resin binders may be used in photoresists. Such polymeric binders may include, as polymerized components, one or more acid functional monomers such as acrylic acid or methacrylic acid. For example, U.S. Pat. No. 5,952,153 (Lundy et al.) discloses photoimageable compositions containing polymeric binders having sufficient acid functionality to render the photoimageable composition developable in alkaline aqueous solution. U.S. Pat. No. 4,537,855 (Ide) discloses polycarboxylic acids used to form polymerizable ester derivatives with ethylenically unsaturated compounds. Such polymerizable ester derivatives are used to form the polymeric binders for photoimageable compositions.

Monomers typically useful in photoresist compositions are any which are cross-linkable. Such monomers cross-link to form a polymerized network having a very large, i.e. infinite, molecular weight. The polymeric binders do not participate in such cross-linking. Rather, the monomers form a polymerized network around the polymeric binders. Typically, polymeric binders contain pendant groups, such as carboxylic acids that react with the developer to increase the water solubility of the binder. Thus, in the unexposed portion, the acid functional polymer is salted in the alkaline solution, while in the exposed area (protected by the cross-linked monomers), the polymer is not affected. During stripping, the polymerized network (of cross-linking monomer) is attacked or degraded by the stripper allowing it to be removed, whereas the polymeric binder remains relatively unaffected by such strippers.

Photoresists may be either liquid or dry film. Liquid photoresists are dispensed on a substrate and then cured. Dry film photoresists are typically laminated to a substrate. Such dry film photoresists are particularly suitable for use in printed wiring board manufacture. One problem with conventional dry film photoresist compositions is that they are difficult to strip from electrolytically plated circuit boards using conventional alkaline aqueous stripping solutions, e.g. 3% sodium hydroxide solution. This problem arises from the demand of circuit board manufacturers to reduce the size of printed circuit boards, while increasing their functional capabilities. Consequently, the circuit lines and spaces on the circuit boards have continued to shrink, as more circuitry needs to be accommodated in smaller spaces. At the same time, metal plating heights have also increased above the thickness of the photoresist. This causes the metal to hang over the photoresist, resulting in a very narrow space containing the photoresist being virtually encapsulated by the overplated metal. The photoresist then becomes trapped by the plated overhang, making it difficult to attack and strip by conventional methods. If the photoresist is not completely stripped or removed, ragged copper circuit lines will result after etching which are unsuitable as they can cause short circuiting of the board.

Some circuit board manufacturers have tried thicker photoresists to accommodate the increasing plating heights, however, this approach is more expensive and limits resolution of the circuit lines. Typically, organic-based (amine- or organic solvent-containing) alkaline stripping solutions are used which produce a smaller stripped particle to facilitate stripping. While such organic-based strippers remove the resist better, they are expensive relative to inorganic-based strippers (e.g. sodium or potassium hydroxide) and have more waste treatment and environmental concerns associated with them. Solvent-strippable photoresists are much less desirable due to workplace regulations limiting or reducing solvent emissions.

Certain polymer binders have been described optionally containing one or more multifunctional monomers. For example, U.S. Pat. No. 5,939,239 (Lundy et al.) discloses polymer binders containing acid functional monomers optionally copolymerized with another monomer, including certain multifunctional monomers. The multifunctional monomers disclosed are tri- or tetra-functional (meth) acrylates esters or relatively low molecular weight, i.e. typically ≦450, difunctional (meth)acrylates esters. Polymer binders containing such tri- and tetra-functional monomers or such relatively low molecular weight difunctional (meth)acrylate esters suffer from gel formation, which makes such polymers unsuitable for use in photoresist compositions.

It is thus desirable to provide photoresist compositions that are easily removed using alkaline aqueous inorganic-based stripping solutions, and that do not form gels.

SUMMARY OF THE INVENTION

It has been surprisingly found that branched binder polymers including branch-point monomers as polymerized units provide photoimageable compositions having improved stripability or removability. It has also been surprisingly found that such branch-point monomers as polymerized units do not adversely affect other properties of the photoimageable composition such as chemical resistance. Further, it has been found that the present branched binder polymers are not subject to gel formation.

In one aspect, the present invention provides a photoresist composition including a branched polymeric binder, a monomer and a photoactive component, wherein the branched polymeric binder includes as polymerized units one or more difunctional branch-point monomers having two polymerizable end groups and a backbone including one or more base cleavable functionalities, provided that if the difunctional branch-point monomer is free of urethane linkages and both polymerizable end groups are (meth)acrylate esters the difunctional branch-point monomer has a molecular weight of ≥450.

In another aspect, the present invention provides a method of manufacturing a printed wiring board including the steps of: a) disposing on a printed wiring board substrate a photoresist ccomposition including a branched polymeric binder, a monomer and a photoactive component, wherein the branched polymeric binder includes as polymerized units one or more difunctional branch-point monomers having two polymerizable end groups and a backbone including one or more base cleavable functionalities, provided that if the difunctional branch-point monomer is free of urethane linkages and both polymerizable end groups are (meth)acrylate esters the difunctional branch-point monomer has a molecular weight of ≥450; b) imaging the photoresist; and c) developing the photoresist.

In a further aspect, the present invention provides a method for forming a relief image including the steps of: a) disposing on a printed wiring board substrate a photoresist composition including a branched binder, a monomer and a photoactive component, wherein the branched polymeric binder includes as polymerized units one or more difunctional branch-point monomers having two polymerizable end groups and a backbone including one or more base cleavable functionalities, provided that if the difunctional branch-point monomer is free of urethane linkages and both polymerizable end groups are (meth)acrylate esters the difunctional branch-point monomer has a molecular weight of ≥450; b) imaging the photoresist; and c) developing the photoresist.

In a still further aspect, the present invention further provides a compound having the formula A—Z—B wherein A and B each include one or more polymerizable groups and Z includes one or more base cleavable groups, wherein the compound has a molecular weight of ≥450.

DETAILED DESCRIPTION OF THE INVENTION

As used throughout this specification, the following abbreviations shall have the following meanings, unless the context clearly indicates otherwise: ° C.=degrees Centigrade; g=grams; mg=milligrams; mJ=millijoules; μm=micron=micrometer; Tg=glass transition temperature; ° F.=degrees Fahrenheit; wt %=percent by weight; and mil= 0.001 inch.

The terms "resin" and "polymer" are used interchangeably throughout this specification. The term "alkyl" refers to linear, branched and cyclic alkyl. The terms "halogen" and "halo" include fluorine, chlorine, bromine, and iodine. Thus the term "halogenated" refers to fluorinated, chlorinated, brominated, and iodinated. "Polymers" refer to both homopolymers and copolymers and include dimers, trimers, oligomers and the like. The term "(meth)acrylate" refers to both acrylate and methacrylate. Likewise, the term "(meth)acrylic" refers to both acrylic and methacrylic. "Monomer" refers to any ethylenically or acetylenically unsaturated compound capable of being polymerized. As used throughout this specification, the term "branch-point monomer" refers to any compound containing two or more polymerizable groups and having one or more base cleavable functionalities in its backbone disposed between the two or more polymerizable groups. "Difunctional branch-point monomer" refers to a branch-point monomer having only two polymerizable end groups, i.e. two end groups that are polymerized into the binder polymer backbone. A "branched" polymer refers to a polymer having an interconnected network, such as interconnected to form a three-dimensional network, but having a finite molecular weight.

The terms "cross-linker" and "cross-linking agent" are used interchangeably throughout this specification. The terms "printed wiring board" and "printed circuit board" are used interchangeably throughout this specification. A "pendant group" refers to any group suspended from a polymer, i.e. only one end of the group is attached to the polymer. Such "pendant group" is not part of the backbone of the polymer.

All amounts are percent by weight and all ratios are by weight, unless otherwise noted. All numerical ranges are inclusive and combinable in any order, except where it is obvious that such numerical ranges are constrained to add up to 100%.

The photoresist compositions of the present invention include a branched polymeric binder, a monomer and a photoactive component, wherein the branched polymeric binder includes as polymerized units one or more difunctional branch-point monomers having two polymerizable end groups and a backbone including one or more base cleavable functionalities, provided that if the difunctional branch-point monomer is free of urethane linkages and both polymerizable end groups are (meth)acrylate esters the difunctional branch-point monomer has a molecular weight of ≥450. In an alternative embodiment, the present invention provides a photoresist composition including a branched polymeric binder, a monomer and a photoactive component, wherein the branched polymeric binder includes as polymerized units one or more difunctional branch-point monomers having a backbone including one or more urethane linkages and one or more base cleavable groups.

A wide variety of polymeric binders are suitable for use in the present invention. Suitable polymeric binders are those containing as polymerized units one or more ethylenically or acetylenically unsaturated monomers and one or more difunctional branch-point monomers having two polymerizable end groups and a backbone including one or more base cleavable functionalities, provided that if the difunctional branch-point monomer is free of urethane linkages and both polymerizable end groups are (meth)acrylate esters the difunctional branch-point monomer has a molecular weight of ≥450. Suitable ethylenically or acetylenically unsaturated monomers include, but are not limited to: (meth) acrylic acid, (meth)acrylamides, alkyl (meth)acrylates, alkenyl (meth)acrylates, aromatic (meth)acrylates, vinyl aromatic monomers, nitrogen-containing compounds and their thio-analogs, substituted ethylene monomers, cyclic olefins, substituted cyclic olefins, and the like. Preferred monomers include (meth)acrylic acid, alkyl (meth)acrylates and vinyl aromatic monomers.

Typically, the alkyl (meth)acrylates useful in the present invention are $(C_1-C_{24})$alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate, methyl acrylate, ethyl acrylate, propyl methacrylate, butyl methacrylate, butyl acrylate, isobutyl methacrylate, hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate (based on branched $(C_{10})$alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate, a mixture of linear and branched isomers of dodecyl, tridecyl, tetradecyl and pentadecyl methacrylates; and lauryl-myristyl methacrylate.

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate, which is a mixture of hexadecyl, octadecyl, cosyl and eicosyl methacrylate; and cetyl-stearyl methacrylate, which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy($C_2$–$C_6$)alkyl (meth)acrylates, dialkylamino ($C_2$–$C_6$)-alkyl (meth)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof.

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl)acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri($C_1$–$C_6$)alkylsilyl (meth)acrylate, γ-propyl di($C_1$–$C_6$)alkoxy ($C_1$–$C_6$)alkylsilyl (meth)acrylate, γ-propyl di($C_1$–$C_6$)alkyl ($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$) alkylsilyl (meth)acrylate, vinyl ($C_1$–$C_6$)alkoxydi($C_1$–$C_6$) alkylsilyl (meth)acrylate, vinyl tri($C_1$–$C_6$)alkylsilyl (meth) acrylate, 2-propylsilsesquioxane(meth)acrylate and mixtures thereof.

The vinyl aromatic monomers useful as unsaturated monomers in the present invention include, but are not limited to: styrene, hydroxystyrene, α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo($C_1$–$C_{10}$)alkyl, carb($C_1$–$C_{10}$)alkoxy, carboxy, amino, ($C_1$–$C_{10}$)alkylamino derivatives and the like.

The nitrogen-containing compounds and their thioanalogs useful as unsaturated monomers in the present invention include, but are not limited to: vinylpyridines such as 2-vinylpyridine or 4-vinylpyridine; ($C_1$–$C_8$)alkyl substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinylpyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride, vinylidene bromide, tetrafluoroethylene, trifluoroethylene, trifluoromethyl vinyl acetate, vinyl ethers and itaconic anhydride.

Suitable cyclic olefin monomers useful in the present invention are ($C_5$–$C_{10}$)cyclic olefins, such as cyclopentene, cyclopentadiene, dicylopentene, cyclohexene, cyclohexadiene, cycloheptene, cycloheptadiene, cyclooctene, cyclooctadiene, norbornene, maleic anhydride and the like. Such cyclic olefins also include spirocyclic olefin monomers such as spirocyclic norbornenyl monomers, spirocyclic cyclohexene monomers, spirocyclic cyclopentene monomers and mixtures thereof. Suitable substituted cyclic olefin monomers include, but are not limited to, cyclic olefins having one or more substituent groups selected from hydroxy, aryloxy, halo, ($C_1$–$C_{12}$)alkyl, ($C_1$–$C_{12}$)haloalkyl, ($C_1$–$C_{12}$)hydroxyalkyl, ($C_1$–$C_{12}$) halohydroxyalkyl such as $(CH_2)_{n'}C(CF_3)_2OH$ where n'=0 to 4, ($C_1$–$C_{12}$)alkoxy, thio, amino, ($C_1$–$C_6$)alkylamino, ($C_1$–$C_6$)dialkylamino, ($C_1$–$C_{12}$)alkylthio, carbo($C_1$–$C_{20}$) alkoxy, carbo($C_1$–$C_{20}$)haloalkoxy, ($C_1$–$C_{12}$)acyl, ($C_1$–$C_6$) alkylcarbonyl($C_1$–$C_6$)alkyl, and the like. Particularly suitable substituted cyclic olefins include maleic anhydride and cyclic olefins containing one or more of hydroxy, aryloxy, ($C_1$–$C_{12}$)alkyl, ($C_1$–$C_{12}$)haloalkyl, ($C_1$–$C_{12}$)hydroxyalkyl, ($C_1$–$C_{12}$)halohydroxyalkyl, carbo ($C_1$–$C_{20}$)alkoxy, and carbo($C_1$–$C_{20}$)haloalkoxy. It will be appreciated by those skilled in the art that the alkyl and alkoxy substituents may be optionally substituted, such as with halogen, hydroxyl, cyano, ($C_1$–$C_6$)alkoxyl, mercapto, ($C_1$–$C_6$)alkylthio, amino, acid labile leaving group and the like. Suitable carbo ($C_1$–$C_{20}$)alkoxy substituents include, but are not limited to, those of the formula C(O)O—LG, wherein LG is a leaving group including, but are not limited to, alkyl groups having 4 or more carbon atoms with at least one quaternary carbon atom bonded directly to a carboxylate oxygen such as tert-butyl esters, 2,3-dimethylbutyl esters, 2-methylpentyl esters, 2,3,4-trimethylpentyl esters, alicyclic esters, acetals or ketals from vinyl ethers or enols such as —O—(CH(CH$_3$) OC$_2$H$_5$) or —O—(CH$_2$OC$_2$H$_5$), tetrahydropyran. Suitable alicyclic esters as leaving groups include adamantyl, methyladamantyl, ethyladamantyl, methnorbornyl, ethylnorbornyl, ethyltrimethylnorbornyl, ethyl fenchol and the like.

Any of a wide variety of difunctional branch-point monomers are suitable for use in preparing the branched binder polymers of the present invention provided that such branch-point monomers contain a backbone comprising one or more base cleavable functionalities or moieties, where such functionalities are disposed between the polymerizable groups of the branch-point monomer, and provided that if the difunctional branch-point monomer is free of urethane linkages and both polymerizable end groups are (meth)acrylate esters the difunctional branch-point monomer has a molecular weight of $\geq 450$. By "base cleavable functionality" is meant any functionality or group that can be cleaved by a base such as hydroxide ion, alkoxide ion, ammonia, amines and the like.

A wide variety of difunctional branch-point monomers containing base cleavable moieties may be used in the present invention. In general, such branch-point monomers have the structure

A—Z—B where A and B each include one or more polymerizable groups, and Z includes one or more base cleavable groups. Suitable polymerizable groups for A and B include, but are not limited to, isocyanate ("—NCO"), RR$^1$C=CR$^2$—, R—C≡C—, RR$^1$C=CR$^2$C(O)—O—, RR$^1$C=CR$^2$—O—, and —C(O)—O—R$^3$; wherein R, R$^1$ and R$^2$ are independently selected from H, ($C_1$–$C_4$)alkyl and halo; R$^3$ is selected from H, ($C_1$–$C_4$)alkyl, and NR$^4$R$^5$; and R$^4$ and R$^5$ are independently selected from H and ($C_1$–$C_4$)alkyl. In addition to one or more base cleavable groups, the group Z may optionally include one or more spacer groups. Z may suitably have the general formula S$_x$BCG$_y$; wherein S is a spacer group; BCG is a base cleavable group; x=0–20 and y=1–30. It is preferred that y=2–20. Suitable spacer groups include, but are not limited to, alkyleneoxy, aryleneoxy, ($C_1$–$C_{20}$)alkylene, substituted($C_1$–$C_{20}$)alkylene, ($C_6$$C_{20}$) aralkylene, substituted ($C_6$–$C_{20}$)aralkylene, and the like. Suitable alkyleneoxy groups have the general formula (—CHR$^6$—CH$_2$O—)$_n$, (—OCHR$^6$—CH$_2$—)$_m$, or (—O—CH$_2$—CH$_2$—CH$_2$—)$_p$, where R$^6$ is H or CH$_3$, and n, m and p are each 1–1000. Exemplary alkyleneoxy groups include ethyleneoxy, propyleneoxy and ethyleneoxy/propyleneoxy mixtures. Aryleneoxy or arylene ether spacers include phenyleneoxy (phylene ether) spacers having the general formula (—C$_6$H$_4$—O—)$_q$ where q=1–1000, biphenylene ethers, phenanthryl ethers, naphthyl ethers, and mixtures thereof. It will be appreciated that the spacer groups may independently be comprised of one or more of the above examples. When two or more spacer groups are used, they may be the same or different.

"Substituted alkyl" refers to any alkyl group having one or more of its hydrogens replaced by another substituent group selected from halo, cyano, hydroxyl, ($C_1$–$C_8$)alkoxy, amino, ($C_1$–$C_6$)alkylamino, di($C_1$–$C_6$)alkylamino, phenyl, carb($C_1$–$C_6$)alkoxy, and the like. Likewise, "substituted aralkyl" refers to any aralkyl group having one or more of its hydrogens replaced by another substituent group selected from halo, cyano, hydroxyl, ($C_1$–$C_8$)alkoxy, amino, ($C_1$–$C_6$) alkylamino, di($C_1$–$C_6$)alkylamino, phenyl, carb($C_1$–$C_6$) alkoxy, and the like.

Such spacer groups may be selected to provide additional properties. For example, alkyleneoxy spacers, such as ethyleneoxy and/or propyleneoxy moieties, may help to emulsify the polymeric binders for use in water borne photoresists. Spacers having extended chain length may also provide improved flexibility and be particularly useful in conformal photoresist formulations. The choice of such spacer groups will depend upon the particular use of the polymer and the other components in the formulation, and is within the ability of one skilled in the art.

Any base cleavable group is suitable for use in Z, but is preferably selected from anhydrides (—C(O)—O—(O) C—), esters (—C(O)—O—), carbonates, sulfonyl esters (—SO$_2$—O—) and the like, and more preferably esters. It is more preferred that the difunctional branch-point monomers contain 2 or more base cleavable groups and still more preferably 3 or more base cleavable groups. Particularly suitable difunctional branch-point monomers contain 4 base cleavable groups, and more particularly 4 or more ester linkages. It is further preferred that the difunctional branch point monomer contain as polymerizable end groups moieties that also contain one or more base cleavable functionalities, such as (meth)acrylate esters. When the difunctional branch-point monomers contain 2 or more base cleavable groups, such groups may be directly bonded to each other or may be separated by one or more spacer groups. An exemplary structure for such branch-point monomers having multiple base cleavable groups is A—(S1)$_{x1}$-BCG1-(S2)$_{x2}$-BCG2-(S3)$_{x3}$-B, wherein S1, S2 and S3 refer to spacer groups 1–3, respectively, BCG1 and BCG2 refer to base cleavable groups 1 and 2, respectively, x1+x2+x3= 0–20, and A, B, S, BCG and B are as defined above. Other suitable structures having more or fewer spacers and/or base cleavable groups or different configurations of such groups are well within the ability of those skilled in the art.

Suitable difunctional branch-point monomers useful in preparing the branched binder polymers of the present invention include, but are not limited to, acrylic anhydride, methacrylic anhydride, and ester linkage containing monomers having (meth)acrylate end groups. Exemplary difunctional branch-point monomers including one or more urethane linkages and having (meth)acrylate end groups are: pdmbi-pcp0200-pdmbi, pdmbi-pcp0201-pdmbi, pdmbi-pcp0230-pdmbi, eh6cl4-hdi-ppg1000-hdi-eh6cl4, eh6cl4-hdi-pcp0230-hdi-eh6cl4, eh6cl4-hdi-ppg425-hdi-dmpa-hdi-ppg425-hdi-eh6cl4, 2hema-hdi-pcp0230-hdi-ppg425-hdi-pcp0230-hdi-2hema, 2hema-hdi-pcp0230-hdi-peg400-hdi-pcp0230-hdi-2hema, 2hema-hdi-pcp0200-hdi-pcp0230-hdi-pcp0200-hdi-2hema, e6hem-hdi-pcp0200-hdi-pcp0230-hdi-pcp0200-hdi-e6hem, e6hem-hdi-pcp0200-hdi-ppg1000-hdi-pcp0200-hdi-e6hem, e6hem-hdi-ppg425-hdi-pcp0230-hdi-ppg425-hdi-e6hem, e6hem-hdi-ppg1000-hdi-pcp0230-hdi-ppg 1000-hdi-e6hem, e6hem-hdi-pcp0230-hdi-ppg425-hdi-pcp0230-hdi-e6hem, and e6hem-hdi-ppg1000-hdi-pcp0201-hdi-ppg1000-hdi-e6hem. In the above described difunctional branch-point monomers, each "dash" represents a urethane group (formed when an isocyanate group reacts with a hydroxyl group) between the adjacent moieties. Such urethane linkages are not required in the present branch-point monomers. The abbreviations for the moieties are: hdi=1,6-hexamethylene diisocyanate; pcp0200=TONE™ Polyol 0200 Diol (containing carboxylic ester groups); pcp0201=TONE™ Polyol 0201 Diol (contains carboxylic ester groups); pcp0230=TONE™ Polyol 0230 Diol (contains carboxylic ester groups); ppg425=polypropylene glycol having a molecular weight of approximately 425; ppg1000=polypropylene glycol having a molecular weight of approximately 1000; dmpa=dimethylolpropionic acid; pdmbi=3-isopropenyl-alpha,alpha-dimethylbenzyl isocyanate; 2hema=2-hydroxyethyl methacrylate (contains ester group and a polymerizable end group); e6hem=ethoxylated hydroxyethyl methacrylate (contains ester group and a polymerizable end group); and eh6cl4=ethoxylated caprolactone-derived methacrylate (contains ester groups and a polymerizable end group). Such branch-point monomers are generally commercially available or may be readily prepared by known methods. TONE™ is a trademark for polycaprolactone diols, available from the Dow Chemical Company (Midland, Mich.). Other suitable polycaprolactone diols are available from Solvay under the CAPA brand name. Typically, the molecular weight of the branch-point monomers is $\geq 450$, and preferably from 450 to 6000.

The branched polymeric binders of the present invention include as polymerized units one or more difunctional branch-point monomers having two polymerizable end groups and a backbone including one or more base cleavable functionalities, provided that if the difunctional branch-point monomer is free of urethane linkages and both polymerizable end groups are (meth)acrylate esters the difunctional branch-point monomer has a molecular weight of $\geq 450$. When polymeric binders are prepared from tri, tetra- or higher-functional branch-point monomers, i.e. those containing 3 or more polymerizable end groups, such polymeric binders are much more likely to suffer from gel formation, which makes such binders unsuitable for use in photoresist compositions. Further, when polymeric binders are prepared from relatively low molecular weight, i.e. <450, difunctional branch-point monomers containing no urethane linkages and containing (meth)acrylate esters as both polymerizable end groups, such polymeric binders also suffer from gel formation. Such gel formation is not a problem when the difunctional branch-point monomers are higher molecular weight, i.e. $\geq 450$ monomers containing (meth)acrylate esters as both polymerizable end groups, or when such monomers contain one or more urethane linkages.

The present invention further provides a compound having the formula A—Z—B wherein A and B each include one or more polymerizable groups and Z includes one or more base cleavable groups, wherein the compound has a molecular weight of $\geq 450$.

It will be appreciated by those skilled in the art that more than one difunctional branch-point monomer may be used to prepare the branched binder polymers of the present invention. Thus, mixtures of difunctional branch-point monomers may advantageously be used in the present invention. Typically, the total amount of such difunctional branch-point monomers in the branched binder polymers is from 0.1 to 100 wt % based upon the total weight of the monomers used to prepare the binder polymer, preferably from 0.1 to 25 wt %, and more preferably from 0.1 to 10 wt %.

The branched binder polymers of the present invention may be prepared by a variety of methods known in the art, such as free radical polymerization.

It will be appreciated that mixtures of binder polymers may be used in the present invention. Thus, the present photoimageable compositions may include one or more polymeric binders. Such mixtures of binder polymers can be two or more different branched binder polymers or one or more branched binder polymer combined with one or more unbranched binder polymers. The binder polymers may be mixed or blended in any suitable ratio. The particular ratio depends upon the specific binder polymers employed, whether they are branched or unbranched, and the specific properties desired. Such ratios are within the ability of one skilled in the art.

It is further preferred that the difunctional branched polymeric binders contain sufficient acid functionality to render the binder polymers soluble and removable upon development. The term "acid functionality" refers to any functionality capable of forming a salt upon contact with alkaline developer, such as dilute alkaline aqueous sodium or potassium hydroxide, e.g. 1 to 3 wt % solutions. Suitable acid functionality includes, but is not limited to, carboxylic acids, sulfonic acids, phosphonic acids and phenols. In general, the binder polymers have an acid number of up to about 250, preferably up to about 200. Typical ranges of acid numbers are from 15 to 250 and preferably from 50 to 250. Such acid numbers are based on the amount of KOH (potassium hydroxide) in mg to neutralize 1 g (dry weight) of binder polymer.

Suitable polymeric binders are generally commercially available from a variety of sources, such as Rohm and Haas Company (Philadelphia, Pa.) or may be prepared by a variety of methods known in the literature. Typically, the polymeric binder is present in the photoimageable compositions in an amount of up to 90 wt %, based on the total weight of the composition, preferably from 20 to 90 wt %, more preferably from 25 to 85 wt %, and even more preferably from 30 to 80 wt %.

Monomers useful in the present photoimageable compositions are any which will polymerize into a network around the branched polymeric binders. A wide variety of monomers may be used. Suitable monomers include, but are not limited to: methyl acrylate, 2-ethylhexyl acrylate, n-butyl acrylate, n-hexyl acrylate, methyl methacrylate, hydroxyethyl acrylate, butyl methacrylate, octyl acrylate, 2-ethoxyethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2–2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate.

The photoimageable compositions of the present invention contain one or more photoactive components. The photoactive components useful in the present invention are may be photoacid generators, photobase generators or free-radical generators. The present photoimageable compositions may be positive-acting or negative-acting, and preferably are negative-acting. It will be appreciated by those skilled in the art that mixtures of photoactive components allow the photoactivity of the compositions to be tailored to specific applications.

Suitable photoacid generators include halogenated triazines, onium salts, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl) hydrazines and the like. Particularly useful halogenated triazines include halomethyl-s-triazines.

Suitable free-radical generators include, but are not limited to, n-phenylglycine, aromatic ketones such as benzophenone, N,N'-tetramethyl-4,4'-diaminobenzophenone [Michler's ketone], N,N'-tetraethyl-4,4'-diaminobenzophenone, 4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer, and the like. Though, not a free-radical generator, triphenylphosphine may be included in the photoactive chemical system as a catalyst. Such free-radical generators are particularly suitable for use with negative-acting photoimageable compositions, and particularly suitable for use with negative-acting dry film photoimageable compositions of the present invention.

Typically, such photoactive components are present in an amount of from 0.05 to 10 wt % based on the total weight of the composition, preferably from 0.1 to 5 wt %, and more preferably from 0.1 to 2 wt %.

The present photoimageable compositions may be solvent-borne or water-borne. Whether such compositions are solvent- or water-borne depends upon the choice of polymer binder, including the choice of monomers and difunctional branch-point monomers used to prepare the polymer binders. Such choices of monomers and difunctional branch-point monomers is well within the ability of one skilled in the art. Thus, the present photoimageable compositions may optionally contain water, a solvent or a water-solvent mixture. Suitable solvents include, but are not limited to: ketone solvents such as acetone, methyl ethyl ketone, cyclohexanone, methyl isoamyl ketone and 2-heptanone; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof; cyclic ether solvents such as dioxane; ester solvents such as methyl lactate, ethyl lactate, methyl acetate, ethyl acetate, butyl acetate, methyl pyruvate, ethyl pyruvate, methyl methoxypropionate and ethyl ethoxypropionate; and amide solvents such as N,N-dimethyl formamide, N,N-dimethyl acetamide, N-methyl-2-pyrrolidone, 3-ethoxyethyl propionate, 2-heptanone, γ-butyrolactone, and mixtures thereof.

Optional additives that may be used in the present photoimageable compositions include, but are not limited to: anti-striation agents, plasticizers, speed enhancers, fillers, dyes, film forming agents, hydrophobic trihalomethyl containing photoresist strip enhancers and the like. Suitable plasticizers include esters such as dibenzoate esters. Suitable hydrophobic trihalomethyl containing photoresist strip enhancers include a wide variety of compounds containing a trihalomethyl group which hydrolyzes to carboxylate anions during stripping of the photoresist. Preferably, such hydrophobic trihalomethyl containing photoresist strip enhancer is alpha-trichloromethyl benzyl acetate. Such optional additives will be present in various concentrations in a photoresist composition. For example, fillers and dyes may be used in relatively large concentrations, e.g. in amounts of from about 5 to 30 percent by weight, based on the total weight of the composition's dry components.

The photoresist compositions of the present invention are typically prepared by combining the branched polymeric binder, monomer, photoactive component, optional solvent and optional additives in any order.

Processing of the photoimageable or photoresist compositions of the invention may be in any conventional manner. In a typical procedure, a photoresist layer, either formed from a liquid composition or transferred as a layer from a dry film, is applied to a substrate. When a liquid photoresist composition is used, it may be applied to a substrate by any known means, such as spinning, dipping, roller coating and the like.

The present photoresist compositions may be used on a variety of substrates used in the manufacture of electronic devices such as printed wiring boards and integrated circuits. Suitable substrates include copper surfaces of copper clad boards, printed wiring board inner layers and outer layers, wafers used in the manufacture of integrated circuits and the like.

Once the photoresist is applied to the substrate, it is imaged or exposed to actinic radiation through appropriate artwork. In the case of a negative-acting photoresist, exposure of actinic radiation polymerizes the cross-linking agent in exposed areas, resulting in a cross-linked structure that is resistant to developer. Next, the composition is developed such as by using dilute alkaline aqueous solution. Suitable developers include 1–3 wt % aqueous solutions of sodium hydroxide or potassium hydroxide. Organic based developers, such as tetraalkylammonium hydroxide based developers, may be used but are less preferred.

During such development, the acidic groups of the binder polymers form salts which render the binder polymers soluble and removable. An advantage provided by the present polymeric binders is that.

Thus, the present invention provides a method for forming a relief image including the steps of: a) disposing on a printed wiring board substrate a photoresist composition including a branched binder, a monomer and a photoactive component, wherein the branched polymeric binder includes as polymerized units one or more difunctional branch-point monomers having two polymerizable end groups and a backbone including one or more base cleavable functionalities, provided that if the difunctional branch-point monomer is free of urethane linkages and both polymerizable end groups are (meth)acrylate esters the difunctional branch-point monomer has a molecular weight of $\geq 450$; b) imaging the photoresist; and c) developing the photoresist.

In the case of negative-acting photoresists applied to copper surfaces of copper clad boards, an etchant may be used after development to remove copper from those areas where the photoresist was removed, thereby forming a printed circuit. The remaining resist is then removed using a stripper.

The present invention further provides a method of manufacturing a printed wiring board including the steps of: a) disposing on a printed wiring board substrate a photoresist composition including a branched polymeric binder, a monomer and a photoactive component, wherein the branched polymeric binder includes as polymerized units one or more difunctional branch-point monomers having two polymerizable end groups and a backbone including one or more base cleavable functionalities, provided that if the difunctional branch-point monomer is free of urethane linkages and both polymerizable end groups are (meth)acrylate esters the difunctional branch-point monomer has a molecular weight of ≧450; b) imaging the photoresist; and c) developing the photoresist.

The present photoresist compositions show enhanced removal as compared to conventional photoresists. Thus, the present invention also provides a method of enhancing the removal of a photoresist composition from a substrate including the step of combining a branched polymeric binder, a monomer and a photoactive component, wherein the branched polymeric binder includes as polymerized units one or more difunctional branch-point monomers having two polymerizable end groups and a backbone including one or more base cleavable functionalities, provided that if the difunctional branch-point monomer is free of urethane linkages and both polymerizable end groups are (meth)acrylate esters the difunctional branch-point monomer has a molecular weight of ≧450 to form a photoresist composition; disposing the photoresist composition of a substrate; imaging the photoresist composition; and developing the imaged photoresist composition. In conventional photoresists, the photoresist is stripped by action of a base on the polymerized monomer network, which is typically cleaved by the base. In conventional photoresists, however, the polymeric binders are at best "salted" by the base, meaning that pendant acid groups are converted to their corresponding salts, thus improving the water solubility of the binder polymers. While not intending to be bound by theory, it is believed that the present branched polymeric binders are also cleaved by the base used to strip the photoresist, thereby removing the resist by chemical breakdown of the polymer binder as well as by dissolution of the polymer binder.

It has also been surprisingly found that the present difunctional branch-point monomers used to prepare the present branched binder polymers do not adversely affect other properties of the photoresist binder such as chemical resistance. Thus, the present photoresist compositions also show improved adhesion as compared to conventional photoresist compositions. Further, the present photoresist compositions show improved, i.e. faster, stripping with substantially no loss of chemical resistance, as compared to conventional photoresist compositions. Typically, as adhesion of a dry film photoresist is improved, the photoresist composition is harder to strip. The present photoresist compositions surprisingly provide both increased adhesion and improved stripping. Additionally, photoresist compositions of the present invention show increased photospeed as compared to conventional photoresist compositions containing polymeric binders that are not branched.

The present photoresist compositions are particularly suitable for use when small features are desired, such as less than or equal to 3 mil lines and spaces. Typically, such small features are harder to plate and thus the substrates, such as printed wiring boards, are left in the plating bath longer resulting in overplate. Such overplate makes removal of conventional photoresists difficult. An advantage of the present invention is that the photoresist is easily and rapidly removed, even from underneath such overplated metal, as compared to conventional photoresists.

The following examples are intended to illustrate further various aspects of the present invention, but are not intended to limit the scope of the invention in any aspect.

EXAMPLE 1

Two binder polymers were prepared as follows.

Comparative Binder: A monomer mixture (25% methacrylic acid, 75% methyl methacrylate) was diluted to 36% by weight with methyl ethyl ketone and then brought to reflux. An initiator was added to initiate the polymerization reaction. Periodic additions of the initiator were added thereafter until the monomers were polymerized.

Branched Binder 1: A monomer mixture of 25% methacrylic acid, 71.5% methyl methacrylate, 3.5% of a moiety containing base cleavable functionalities having the formula pdmbi-pcp0200-pdmbi, where the "dashes" represent urethane linkages was diluted to 36% by weight with methyl ethyl ketone and then brought to reflux. An initiator was added to initiate the polymerization reaction. Periodic additions of initiator were added thereafter until the monomers were polymerized. The resulting branched binder had the generalized structure:

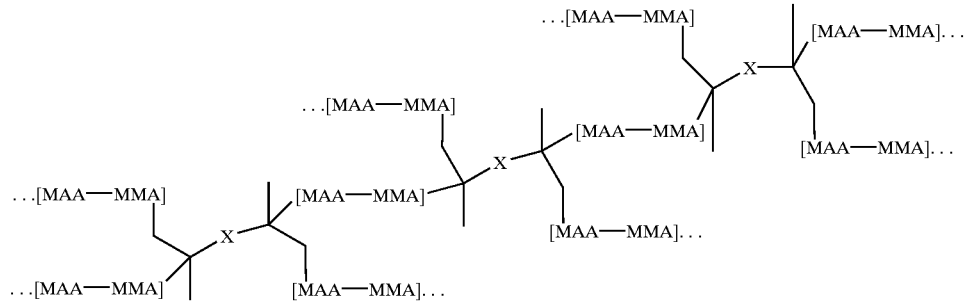

wherein X has the generalized structure:

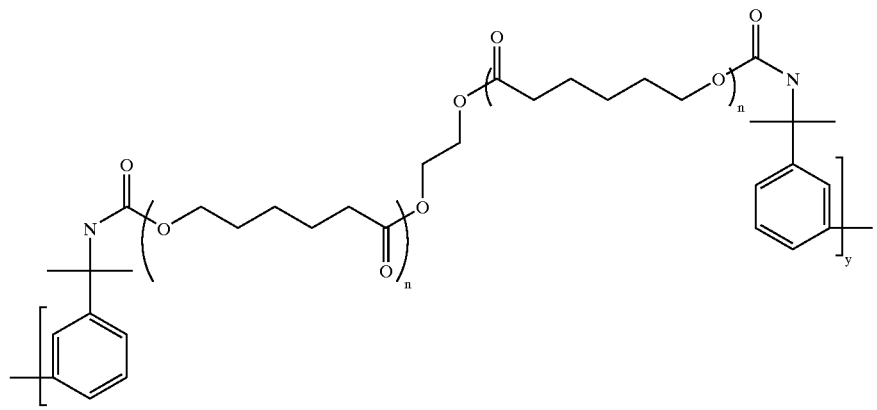

and wherein y=1 and n=2. In the above structure, MMA refers to methyl methacrylate and MAA refers to methacrylic acid. The ellipses indicate that the MMA-MAA units are further attached to other MMA-MAA units as well as other branch-point monomers, forming a network having a finite, i.e. not infinite, molecular weight.

EXAMPLE 2

Photoresist compositions were prepared by combining the polymer binders from Example 1 (53 wt %) with bisphenol A 10 ethoxy dimethacrylate monomer (43 wt %), commercially available initiator 1 (3.5 wt %), commercially available initiator 2 (0.05 wt %), green background dye (0.05 wt %), antioxidant (0.2 wt %) and flow additive (0.2 wt %). The above ingredients were mixed to a 50% solids mixture in a 4:1 mixture of methyl ethyl ketone and iso-propanol. After mixing for 2 to 4 hours using a lab mixer, the 50% solids mixture was dried on 0.8 mil thick polyester at approximately 80° C. for 3 to 9 minutes. The 50 micron thick, dried photoresist (less than 1.0% residual solvents) was then covered with 1.0 mil thick polyethylene forming a package of polyester/resist/polyethylene (finished "dry film").

EXAMPLE 3

The negative working, photoresist composition from Example 2 was hot roll laminated to a cleaned, copper clad panel. The laminated panel were then covered with an artwork (phototool) and imaged with UV radiation using an Optibeam 7100 with enough energy to achieve a copper step 9 using a Stouffer 21 Step Wedge. After exposure, the polyester sheet was removed and the resist was then developing in 1% sodium carbonate monohydrate at 30° C. In the development process, the unexposed resist was removed. After development, the remaining (exposed) lines were examined for defects. The smallest lines with no defects and with 400 microns spaces were recorded as the fine line adhesion. Smaller lines are more easily attacked in the developing solution and by the conveyor equipment, thus a lower number indicates better adhesion. After examining the developed lines, the panels were then plated in a copper sulfate electrolytic plating bath until the resist height (50 microns) was exceeded by 20% (60 microns of plating). The exposed resist was then stripped from the panel with 3% sodium hydroxide at 50° C. The resulting times for the complete removal of the photoresist were recorded. The results are reported in Table 1.

TABLE 1

| Sample | Photospeed for Copper Step 9 | Fine Line Adhesion | Strip Time |
| --- | --- | --- | --- |
| Comparative | 77 mJ | 33 μm | 28.2 sec |
| 1 | 65 mJ | 27 μm | 18.5 sec |

It can be clearly seen from these data that photoresist compositions of the present invention have improved adhesion, increased photospeed and reduced stripping time as compared to conventional photoresists.

EXAMPLE 4

Other suitable branched binder polymers were prepared according to Example 1. These polymers are reported in Table 2 in terms of the monomers used to prepare the polymers.

TABLE 2

| Branched Polymer | BM1 (%) | BM2 (%) | BM3 (%) | BM4 (%) | CM1 (%) | CM2 (%) | CM3 (%) | CM4 (%) | CM5 (%) |
| --- | --- | --- | --- | --- | --- | --- | --- | --- | --- |
| A | 1 | — | — | — | — | — | 20 | 73 | 6 |
| B | 2 | — | — | — | — | — | 20 | 72 | 6 |
| C | — | 1 | — | — | — | — | 25 | 74 | — |
| D | — | 2 | — | — | — | — | 25 | 73 | — |
| E | — | 3 | — | — | — | — | 25 | 72 | — |
| F | — | 3.5 | — | — | — | — | 25 | 71.5 | — |
| G | — | 4 | — | — | — | — | 25 | 71 | — |
| H | — | 5 | — | — | — | — | 25 | 70 | — |
| I | — | 7 | — | — | — | — | 25 | 68 | — |
| J | — | — | 1 | — | — | — | 25 | 74 | — |

TABLE 2-continued

| Branched Polymer | BM1 (%) | BM2 (%) | BM3 (%) | BM4 (%) | CM1 (%) | CM2 (%) | CM3 (%) | CM4 (%) | CM5 (%) |
|---|---|---|---|---|---|---|---|---|---|
| K | — | — | 2 | — | — | — | 25 | 73 | — |
| L | — | — | 3 | — | — | — | 25 | 72 | — |
| M | — | — | 4 | — | — | — | 25 | 71 | — |
| N | — | — | 5 | — | — | — | 25 | 70 | — |
| O | — | 1 | — | — | — | 5 | 25 | 69 | — |
| P | — | 1 | — | — | — | 10 | 25 | 64 | — |
| Q | — | 1 | — | — | — | 15 | 25 | 59 | — |
| R | — | 3 | — | — | — | 5 | 25 | 67 | — |
| S | — | 3 | — | — | — | 10 | 25 | 62 | — |
| T | — | 3 | — | — | — | 15 | 25 | 57 | — |
| U | — | 5 | — | — | — | 5 | 25 | 65 | — |
| V | — | — | — | 1 | 10 | — | 25 | 64 | — |
| W | — | — | — | 4 | 10 | — | 25 | 61 | — |
| X | — | — | — | 1 | — | 10 | 25 | 64 | — |
| Y | — | — | — | 2 | — | 10 | 25 | 63 | — |

All amounts in Table 2 are reported in percent by weight of the total weight of monomers used to prepare the polymer. The branch-point monomers ("BM") used were: BM1=methacrylic anhydride; BM2=pdmbi-pcp0200-pdmbi; BM3=pdmbi-pcp0230-pdmbi; and BM4=eh6cl4-hdi-ppg1000-hdi-eh6cl4. The conventional monomers ("CM") used were: CM1=ethoxylated hydroxyethyl methacrylate; CM2=eh6cl4; CM3=methacrylic acid; CM4=methyl methacrylate; and CM5=n-butyl acrylate.

EXAMPLE 5

Comparative

The procedure of Example 1 was repeated using monomers containing one or more base cleavable groups, having (meth)acrylate esters as the polymerizable groups and having a molecular weight of <450. The monomers used, the amounts and the molecular weights of the monomers are reported in Table 3.

TABLE 3

| Monomer | (Meth)acrylic Functionality | Molecular Weight | Percent Incorporation | Gelation |
|---|---|---|---|---|
| Dipropylene glycol diacrylate | 2 | 242 | 2.0 | Yes |
| Dipropylene glycol diacrylate | " | " | 4.0 | " |
| Dipropylene glycol diacrylate | " | " | 8.0 | " |
| Tripropylene glycol diacrylate | 2 | 300 | 2.0 | " |
| Tripropylene glycol diacrylate | " | " | 4.0 | " |
| Tripropylene glycol diacrylate | " | " | 8.0 | " |
| Pentaerythritol tetraacrylate | 4 | 352 | 2.0 | " |
| Pentaerythritol tetraacrylate | " | " | 4.0 | " |
| Pentaerythritol tetraacrylate | " | " | 8.0 | " |
| Trimethylolpropane 3 ethoxy triacrylate | 3 | 428 | 2.0 | " |
| Trimethylolpropane 3 ethoxy triacrylate | " | " | 4.0 | " |
| Trimethylolpropane 3 ethoxy triacrylate | " | " | 8.0 | " |

As can be seen from the above data, monomers having (meth)acrylate esters as the polymerizable groups and having a molecular weight of <450 gelled during the polymerizations. Thus, such monomers are unsuitable for use as branch-point monomers in preparing the branched polymers of the present invention.

What is claimed is:

1. A photoresist composition comprising a branched polymeric binder, a monomer and a photoactive component, wherein the branched polymeric binder comprises as polymerized units one or more difunctional branch-point monomers having two polymerizable end groups and a backbone comprising 2 or more base cleavable functionalities, provided that if the difunctional branch-point monomer is free of urethane linkages and both polymerizable end groups are (meth)acrylate esters the difunctional branch-point monomer has a molecular weight of ≧450.

2. The composition of claim 1 wherein the photoresist is negative-acting.

3. The composition of claim 1 in the form of a dry film photoresist.

4. The composition of claim 1 wherein the photoactive component is selected from the group consisting of 9-phenylacridine, n-phenylglycine, benzophenone, N,N'-tetramethyl-4,4'-diaminobenzophenone, N,N'-tetraethyl-4,4'-diaminobenzophenone, 4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone, benzoin, benzoinmethylether, benzoinethylether, benzoinisopropylether, benzoin-n-butylether, benzoin-phenylether, methylbenzoin, ethybenzoin, dibenzyl, benzyldiphenyldisulfide, benzyldimethylketal, 1,7-bis(9-acridinyl)heptane, 2-chlorothioxanthone, 2-methylthioxanthone, 2,4-diethylthioxanthone, 2,4-dimethylthioxanthone, 2-isopropylthioxanthone, 1,1-dichloroacetophenone, p-t-butyldichloroacetophenone, 2,2-diethoxyacetophenone, 2,2-dimethoxy-2-phenylacetophenone, 2,2-dichloro-4-phenoxyacetophenone, 2-(o-chlorophenyl)-4,5-diphenylimidazole dimer, 2-(o-chlorophenyl)-4,5-di(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer.

5. The composition of claim 1 wherein the polymeric binder comprises sufficient acid functionality to render said photoresist composition developable in alkaline aqueous solution.

6. The composition of claim 1 wherein the polymeric binder has an acid number of from about 50 to about 250.

7. The composition of claim 1 wherein the 2 or more base cleavable functionalities are selected from the group consisting of anhydrides, esters, carbonates, and sulfonyl esters.

8. The composition of claim 1 wherein the branched polymeric binder comprises from 0.1 to 25 wt % of the one or more branch-point monomers, based upon the total weight of monomers in the polymeric binder.

9. The composition of claim 1 wherein the monomer is selected from the group consisting of methyl acrylate, 2-ethylhexyl acrylate, n-butyl acrylate, n-hexyl acrylate, methyl methacrylate, hydroxyethyl acrylate, butyl methacrylate, octyl acrylate, 2-ethoxyethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylopropane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylolpropane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylolpropane trimethacrylate, 1,5-pentanediol dimethacrylate, and 1,4-benzenediol dimethacrylate; styrene and substituted styrene; vinyl toluene and vinyl esters.

10. The composition of claim 1 wherein the polymeric binder further comprises as polymerized units one or more monomers selected from the group consisting of (meth) acrylic acid, (meth)acrylamides, alkyl (meth)acrylates, alkenyl (meth)acrylates, aromatic (meth)acrylates, vinyl aromatic monomers, nitrogen-containing compounds and their thio-analogs, substituted ethylene monomers, cyclic olefins and substituted cyclic olefins.

11. A method of manufacturing a printed wiring board comprising the steps of: a) disposing on a printed wiring board substrate a photoresist composition comprising a branched polymeric binder, a monomer and a photoactive component, wherein the branched polymeric binder comprises as polymerized units one or more difunctional branch-point monomers having two polymerizable end groups and a backbone including 2 or more base cleavable functionalities, provided that if the difunctional branch-point monomer is free of urethane linkages and both polymerizable end groups are (meth)acrylate esters the difunctional branch-point monomer has a molecular weight of ≧450; b) imaging the photoresist; and c) developing the photoresist.

12. The method of claim 11 wherein the branched polymeric binder comprises from 0.1 to 25 wt % of the one or more branch-point monomers, based upon the total weight of monomers in the polymeric binder.

13. The method of claim 11 wherein the 2 or more base cleavable functionalities are selected from the group consisting of anhydrides, esters, carbonates, and sulfonyl esters.

14. The method of claim 11 wherein the polymeric binder comprises sufficient acid functionality to render said photoresist composition developable in alkaline aqueous solution.

15. The method of claim 11 wherein the photoactive component is selected from the group consisting of 9-phenylacridine, n-phenylglycine, benzophenone, N,N'-tetramethyl-4,4'-diaminobenzophenone, N,N'-tetraethyl-4, 4'-diaminobenzophenone, 4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone, benzoin, benzoinmethylether, benzoinethylether, benzoinisopropylether, benzoin-n-butylether, benzoin-phenylether, methylbenzoin, ethybenzoin, dibenzyl, benzyldiphenyldisulfide, benzyldimethylketal, 1,7-bis(9-acridinyl)heptane, 2-chlorothioxanthone, 2-methylthioxanthone, 2,4-diethylthioxanthone, 2,4-dimethylthioxanthone, 2-isopropylthioxanthone, 1,1-dichloroacetophenone, p-t-butyldichloroacetophenone, 2,2-diethoxyacetophenone, 2,2-dimethoxy-2-phenylacetophenone, 2,2-dichloro-4-phenoxyacetophenone, 2-(o-chlorophenyl)-4,5-diphenylimidazole dimer, 2-(o-chlorophenyl)-4,5-di(m-methoxyphenyl imidazole dimer, 2-(o-fluorophenyl)-4,5-diphenylimidazole dimer, 2-(o-methoxyphenyl)-4,5-diphenylimidazole dimer,2-(p-methoxpyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer.

16. The method of claim 11 wherein the polymeric binder further comprises as polymerized units one or more monomers selected from the group consisting of (meth)acrylic acid, (meth)acrylamides, alkyl (meth)acrylates, alkenyl (meth)acrylates aromatic (meth)acrylates, vinyl aromatic monomers, nitrogen-containing compounds and their thio-analogs, substituted ethylene monomers, cyclic olefins and substituted cyclic olefins.

17. The method of claim 11 wherein the polymeric binder has an acid number of from about 50 to about 250.

18. A method for forming a relief image comprising the steps of: a) disposing on a printed wiring board substrate a photoresist composition comprising a branched polymeric binder, a monomer and a photoactive component, wherein the branched polymeric binder comprises as polymerized units one or more difunctional branch-point monomers having two polymerizable end groups and a backbone comprising 2 or more base cleavable functionalities, provided that if the difunctional branch-point monomer is free of urethane linkages and both polymerizable end groups are (meth)acrylate esters the difunctional branch-point monomer has a molecular weight of ≧450; b) imaging the photoresist; and c) developing the photoresist.

* * * * *